US011956588B2

(12) United States Patent
Briggs et al.

(10) Patent No.: US 11,956,588 B2
(45) Date of Patent: *Apr. 9, 2024

(54) CONTACT DETECTION VIA IMPEDANCE ANALYSIS

(71) Applicant: Meta Platforms Technologies, LLC, Menlo Park, CA (US)

(72) Inventors: Drew Stone Briggs, Seattle, WA (US); Morteza Khaleghimeybodi, Bothell, WA (US); Chuming Zhao, Bothell, WA (US); John Raymond Brodie, Bend, OR (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/099,855

(22) Filed: Jan. 20, 2023

(65) Prior Publication Data

US 2023/0156396 A1     May 18, 2023

Related U.S. Application Data

(63) Continuation of application No. 17/183,311, filed on Feb. 23, 2021, now Pat. No. 11,570,538.

(51) Int. Cl.
*H04R 1/10* (2006.01)
*G01R 27/02* (2006.01)
*H04R 5/04* (2006.01)

(52) U.S. Cl.
CPC .......... *H04R 1/1041* (2013.01); *G01R 27/02* (2013.01); *H04R 1/1083* (2013.01); *H04R 5/04* (2013.01);

(Continued)

(58) Field of Classification Search
CPC ...... H04R 1/1041; H04R 1/1083; H04R 5/04; G01R 27/02
See application file for complete search history.

(56) References Cited

U.S. PATENT DOCUMENTS 9,900,709 B2     2/2018 Hillbratt et al.
10,412,510 B2 *  9/2019 Bervoets ............ H04R 25/606
(Continued)

OTHER PUBLICATIONS

Hosoi, Hiroshi, "Cartilage conduction hearing aids: the third pathway for sound transmission and its application," ENT and Audiology News, vol. 28, No. 6, retrieved from <<https://www.entandaudiologynews.com/features/audiology-features/post/cartilage-conduction-hearing-aids-the-third-pathway-for-sound-transmission-and-its-application>>, Jan. 7, 2020, 3 pages.

(Continued)

*Primary Examiner* — Simon King
(74) *Attorney, Agent, or Firm* — Jordan IP Law, LLC

(57) ABSTRACT

An electronic device may include one or more terminals configured to provide a voltage signal to an actuator. The electronic device may detect a current associated with the voltage signal provided by the terminal to the actuator. The electronic device may determine an impedance across associated with the actuator based on the voltage signal and the electrical current. The electronic device may compare the impedance to a threshold impedance to determine whether there is sufficient skin contact with the actuator. The electronic device may provide audio via cartilage conduction if there is sufficient contact based on comparing the impedance to the threshold impedance, or may output a notification to the user to adjust placement of the electronic device to improve contact.

20 Claims, 7 Drawing Sheets

(52) U.S. Cl.
CPC ...... *H04R 2420/05* (2013.01); *H04R 2460/13* (2013.01)

(56) References Cited

U.S. PATENT DOCUMENTS

| | | | |
|---|---|---|---|
| 11,166,109 B2* | 11/2021 | Meskens | H04R 25/606 |
| 11,245,991 B2 | 2/2022 | Hillbratt et al. | |
| 11,570,538 B1* | 1/2023 | Briggs | H04R 1/1083 |
| 2013/0197298 A1* | 8/2013 | Miller | H04R 25/00 |
| | | | 600/25 |
| 2014/0286513 A1* | 9/2014 | Hillbratt | G01R 31/2829 |
| | | | 381/326 |
| 2014/0288356 A1* | 9/2014 | Van Vlem | H04R 25/606 |
| | | | 600/25 |
| 2018/0242088 A1 | 8/2018 | Hillbratt et al. | |
| 2020/0296520 A1* | 9/2020 | Meskens | H04R 25/606 |
| 2021/0321208 A1 | 10/2021 | Cumming | |
| 2022/0159388 A1 | 5/2022 | Hillbratt et al. | |

OTHER PUBLICATIONS

Office Action for U.S. Appl. No. 17/183,311, dated Jun. 16, 2022, Briggs, "Contact Detection via Impedance Analysis", 8 pages.

* cited by examiner

CONTACT DETECTION VIA IMPEDANCE ANALYSIS

RELATED APPLICATIONS

This application claims priority to and is a continuation of U.S. patent application Ser. No. 17/183,311, filed on Feb. 23, 2021, the entire contents of which are incorporated herein by reference.

FIELD OF THE INVENTION

The present disclosure generally relates to an audio system in an electronic device, and specifically relates to determining whether adequate contact is made by a device with a user to deliver audio via cartilage conduction.

BACKGROUND

Computing devices are increasingly taking on different forms and, as such, different techniques for delivering audio are needed based on a type of a device, a size of a device, whether and how a device is worn, and so forth. For example, cartilage conduction is a technique for audio delivery that may be used to supplement and/or in place of a traditional speaker to deliver audio. Cartilage conduction typically involves a mechanical actuator that vibrates the soft tissues near the ear canal entrance, typically near the pinna or the tragus. Location of the device delivering audio via cartilage conduction relative to the ear canal entrance may affect how the audio is received by a user of the device.

SUMMARY

An audio system is described herein. The audio system is configured to determine an electrical impedance associated with a cartilage conduction actuator, and to use the impedance to determine whether there is sufficient contact to deliver audio via cartilage conduction. In some examples, the audio system may provide a notification to a wearer of a device if the impedance indicates that insufficient contact is made with the user, such as indicating to the user to adjust a position of the device. Once appropriate impedance characteristics are established, the audio system may deliver audio via cartilage conduction, with confidence that the audio is being received by the user as intended.

In some examples, an audio system provides, via a first terminal of a wearable device, a voltage signal to an actuator configured to contact skin of a user, where the actuator is associated with the wearable device. The audio system may detect an electrical current associated with the voltage signal provided to the actuator. The audio system may determine, based at least in part on the voltage signal and the electrical current, an impedance associated with the actuator. In examples, the audio system compares the impedance to a threshold impedance, and responsive to determining that the impedance is greater than the threshold impedance, outputs a notification to the user of the wearable device to adjust a placement of the wearable device to reduce the impedance.

In some examples, an electronic device that provides cartilage conduction is disclosed. The electronic device may include at least a terminal configured to provide a voltage signal, and an actuator configured to receive the voltage signal. In at least some examples, the electronic device includes one or more processors, and one or more computer-readable media storing instructions that, when executed by the one or more processors, configure the electronic device to perform operations. The operations may include providing the voltage signal to the actuator via the terminal, and detecting an electrical current associated with the voltage signal provided to the actuator. In some instances, the operations may include determining, based at least in part on the voltage signal and the electrical current, an impedance associated with the actuator. The operations may further include comparing the impedance to a threshold impedance associated with cartilage conduction, and responsive to determining that the impedance is greater than the threshold impedance, outputting a notification to a user of the electronic device to adjust a placement of the actuator to reduce the impedance.

Figure 1:
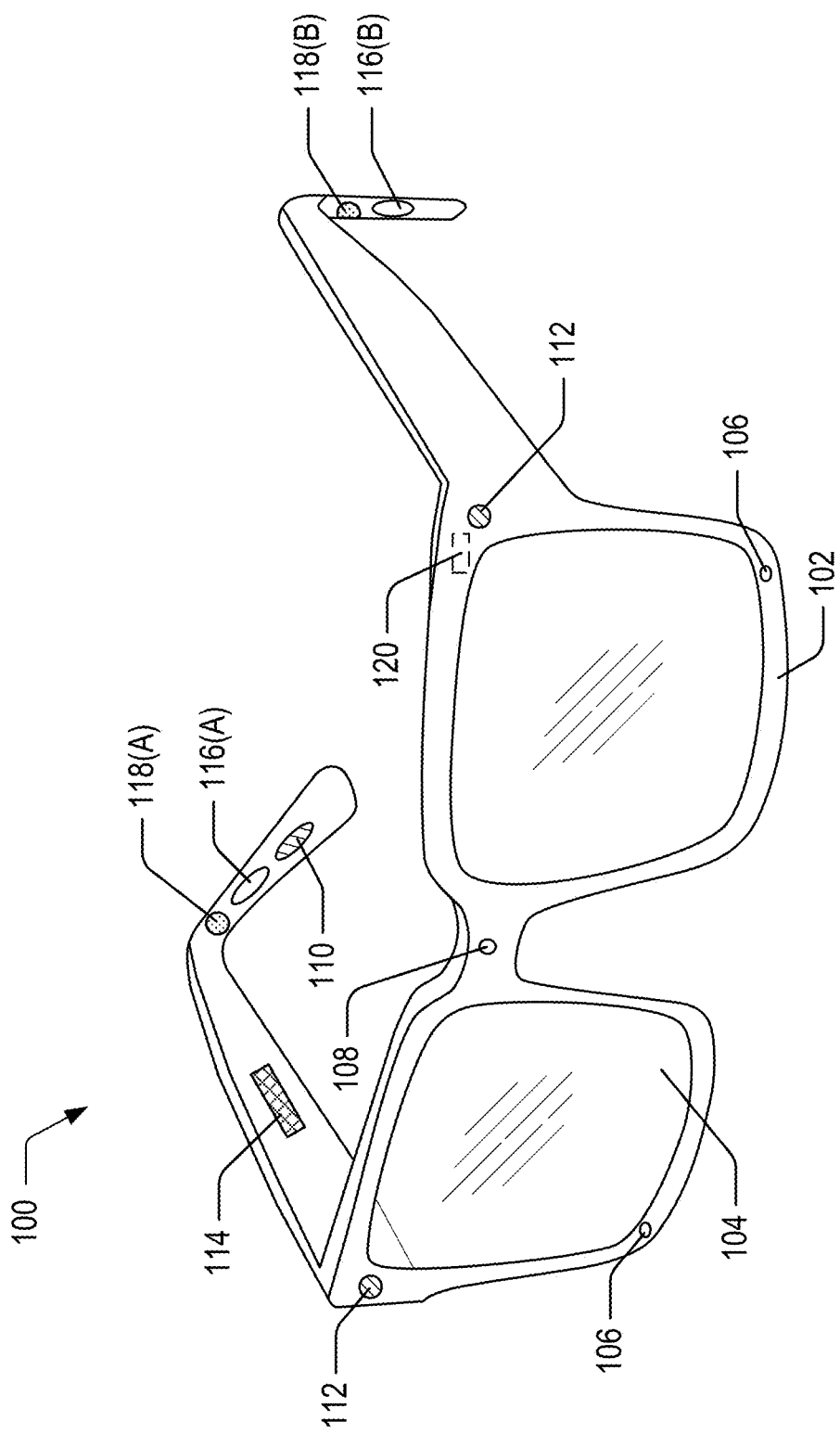
FIG. 1 is a perspective view of an example electronic device, implemented as an eyewear device, that includes an audio system configured to detect contact via impedance analysis, in accordance with one or more examples.

The figures depict various embodiments for purposes of illustration only. One skilled in the art will readily recognize from the following discussion that alternative embodiments of the structures and methods illustrated herein may be employed without departing from the principles described herein.

DETAILED DESCRIPTION

As discussed above, a location of a device delivering audio via cartilage conduction relative to the ear canal entrance may affect how the audio is received by a user of the device. In some examples, cartilage conduction may be used as an audio delivery mechanism for electronic devices such as, without limitation, augmented reality (AR) and/or virtual reality (VR) devices, hearing aids, mobile devices, glasses or other headwear devices, headphones, earbuds, and so forth. In some examples, ensuring that proper contact is made with skin of a user of a device that delivers audio via cartilage conduction can improve the sound perceived by a user of the device. However, conventional techniques for ensuring proper contact for cartilage conduction have relied upon soliciting feedback from the user while sounds were provided, where the feedback could be related to features such as loudness and quality of the sound. Such conventional techniques required skilled listeners to be able hear the prompts and provide accurate and actionable feedback, and in some cases required substantial and prolonged user interaction to set up the device to implement cartilage conduction. Accordingly, the described techniques reduce (or eliminate) the need for user feedback of sound assessment for cartilage conduction by determining whether proper contact is made via an electrical impedance analysis.

For instance, an audio system may include one or more terminals configured to emit and/or receive electrical signals by providing a voltage signal to an actuator. The audio system may detect an electrical current associated with the voltage signal applied between the terminal and the actuator. In at least some examples, the audio system determines an impedance associated with the actuator based on the voltage signal and the electrical current. For example, if the audio system determines that the detected impedance is at or below a threshold impedance, the audio system may determine that there is sufficient contact to supply audio via cartilage conduction. However, if the audio system determines that the detected impedance is above the threshold impedance, the audio system may determine that there is insufficient skin contact to supply audio via cartilage conduction, and may output a notification to the user to adjust placement of a device associated with the terminals to improve contact. Alternatively or in addition to comparing the detected impedance to a threshold impedance, the audio system may determine a contact force (also referred to herein as "preloading force") applied to the actuator by the user, and use the contact force to determine quality of contact between the actuator and the user. Because impedance changes as a function of contact force applied to an actuator, the audio system may use the impedance to determine an amount of force applied to the actuator.

Accordingly, techniques such for supplying audio via cartilage conduction can be employed with greater accuracy and improved sound quality without the need for the user to hear and respond to audio prompts in order to set up the device to implement cartilage conduction. The audio systems described herein may be included in electronic devices that provide audio, such as via one or more speakers and/or mechanical actuators. Examples of electronic devices include, but are not limited to, wearable devices (e.g., glasses, headsets, helmets, hearing aids, etc.), mobile devices (e.g., phones, tablets, etc.), video game systems or controllers, headphones, earbuds, or other portable or stationary electronic devices.

Examples of the present disclosure may include or be implemented in conjunction with an extended reality system. As used herein, the term "extended reality environment" refers to a simulated environment in which users can fully or partially immerse themselves. For example, an extended reality environment can comprise virtual reality, augmented reality, mixed reality, etc. An extended reality environment can include objects and elements with which a user can interact. In many cases, a user participates in an extended reality environment using a computing device, such as a dedicated extended reality device. As used herein, the term "extended reality device" refers to a computing device having extended reality capabilities and/or features. In particular, an extended reality device can refer to a computing device that can display an extended reality graphical user interface. An extended reality device can further display one or more visual elements within the extended reality graphical user interface and receive user input that targets those visual elements. For example, an extended reality device can include, but is not limited to, a virtual reality device, an augmented reality device, or a mixed reality device. In particular, an extended reality device can include any device capable of presenting a full or partial extended reality environment. Nonlimiting examples of extended reality devices can be found throughout this application. For instance, the extended reality system that provides the extended reality content may be implemented on various platforms, including a headset (e.g., head-mounted display (HMD) and/or near-eye display (NED)) connected to a host computer system, a standalone headset, a mobile device or electronic device or system, or any other hardware platform capable of providing extended reality content to one or more viewers.

System Overview

FIG. 1 is a perspective view of an example headset 100, implemented as an eyewear device, configured to detect contact via an impedance analysis in accordance with the techniques described herein. In some examples, the eyewear device is a near eye display (NED). In general, the headset 100 may be worn on the face of a user such that content (e.g., media content) is presented using a display assembly and/or an audio system. Examples are also considered in which the headset 100 presents media content to a user in a different manner. Examples of media content presented by the headset 100 include one or more images, video, audio, or some combination thereof. The headset 100 includes a frame 102, and may include, among other components, a display assembly including one or more display elements 104, a depth camera assembly (DCA), and an audio system. While FIG. 1 illustrates the components of the headset 100 in example locations on the headset 100, the components may be located elsewhere on the headset 100, on a peripheral device paired with the headset 100, or some combination thereof. Similarly, there may be more or fewer components on the headset 100 than what is shown in FIG. 1.

The frame 102 may hold the components of the headset 100. In some examples, the frame 102 includes a front portion that holds the one or more display elements 104, and side or end pieces (e.g., temples) to attach the headset 100 to a head of the user. In some cases, the front portion of the frame 102 bridges the top of a nose of the user. The length of the end pieces may be adjustable (e.g., adjustable temple length) to fit different users. The end pieces may also include a portion that sits on and/or curls behind the ear of the user (e.g., temple tip, ear piece, etc.).

The one or more display elements 104 may emit light visible to a user wearing the headset 100. As illustrated, the headset 100 includes a display element 104 for each eye of the user, although other configurations of the display elements are also considered. In some examples, a display element 104 generates image light that is provided to an eyebox of the headset 100. The eyebox may correspond to a location in space that an eye of user occupies while wearing the headset 100. For example, a display element 104 may be a waveguide display. A waveguide display includes a light source (e.g., a two-dimensional source, one or more line sources, one or more point sources, etc.) and one or more waveguides. Light from the light source is in-coupled into the one or more waveguides which outputs the light in a manner such that there is pupil replication in an eyebox of the headset 100. In examples, the display elements 104 may use one or more diffraction gratings to perform in-coupling and/or outcoupling of light from the one or more waveguides. In some examples, the waveguide display includes a scanning element (e.g., waveguide, mirror, etc.) that scans light from the light source as the light is in-coupled into the one or more waveguides. In some cases, one or both of the display elements 104 are opaque and do not transmit light from a local area or environment around the headset 100 through the display elements 104 to the eyebox. For example, the local area may be a room that a user wearing the headset 100 is inside, or the user wearing the headset 100 may be outside and the local area is an outside area. In cases in which the display elements 104 are opaque, the headset 100 may generate VR content to be viewed via the display elements 104. In some examples, the VR content may include a reproduced (e.g., video) image of the local area and/or computer generated content. Examples are also considered in which one or both of the display elements 104 are at least partially transparent, such that light from the local area may be combined with light from the one or more display elements 104 to produce AR and/or MR content.

In some examples, a display element 104 is a lens that transmits light from the local area to the eyebox. For instance, one or both of the display elements 104 may be a lens without correction (non-prescription) or a prescription lens (e.g., single vision, bifocal and trifocal, or progressive) to help correct for defects in a user's eyesight. In some examples, the display element 104 may be polarized and/or tinted to protect the user's eyes from the sun.

In some examples, the display element 104 may include an optics block (not shown). The optics block may include one or more optical elements (e.g., lens, Fresnel lens, etc.) that direct light from the display element 104 to the eyebox. The optics block may, in some cases, correct for aberrations in some or all of the image content, magnify some or all of the image, or some combination thereof.

The DCA may determine depth information for a portion of a local area surrounding the headset 100. In examples, the DCA includes one or more imaging devices 106, a DCA controller (not shown in FIG. 1), and an illuminator 108. In some examples, the illuminator 108 illuminates a portion of the local area with light. The light may be, for instance, structured light (e.g., dot pattern, bars, etc.) in the infrared (IR), IR flash for time-of-flight, and so forth. In some examples, the one or more imaging devices 106 capture images of the portion of the local area that include the light from the illuminator 108. The example headset 100 includes a single illuminator 108 and two imaging devices 106, but alternate configurations including differing numbers of illuminators and/or imaging devices are also considered.

The DCA controller may compute depth information for at least a portion of the local area using captured images and one or more depth determination techniques. The DCA controller may utilize depth determination techniques such as, but not limited to, direct time-of-flight (ToF) depth sensing, indirect ToF depth sensing, structured light, passive stereo analysis, active stereo analysis (e.g., using texture added to the scene by light from the illuminator 108), other technique(s) to determine depth of a scene, or some combination thereof. In some examples, the headset 100 may perform simultaneous localization and mapping (SLAM) for a position of the headset 100 and updating of a model of the local area. For example, the headset 100 may include a passive camera assembly (PCA) that generates color image data. The PCA may include one or more RGB cameras that capture images of some or all of the local area. In some examples, some or all of the imaging devices 106 of the DCA may also function as the PCA. The images captured by the PCA and the depth information determined by the DCA may be used by the headset 100 to determine parameters of the local area, generate a model of the local area, update a model of the local area, or some combination thereof.

Additionally, the headset 100 may include one or more sensor arrays 110 that generate measurement signals in response to motion of the headset 100 and track the position (e.g., location and pose) of the headset 100 within the environment. The sensor array(s) 110 may include, for example, an optical displacement sensor, an inertial measurement unit, an accelerometer, a gyroscope, or another suitable type of sensor that detects motion, or some combination thereof.

In some examples, the headset 100 includes an audio system (described in detail in relation to FIG. 3) that includes one or more microphone arrays 112, one or more speakers 114, an actuator 116(A), an actuator 116(B) (collectively, "actuators 116"), a terminal 118(A), a terminal 118(B) (collectively, "terminals 118"), and an audio controller 120. The microphone array(s) 112 may include one or more directional and/or omnidirectional microphones. For instance, a directional microphone may have increased sensitivity to sounds arriving from a particular direction relative to the microphone, while an omnidirectional microphone is generally uniform in capturing sounds from any direction. The microphone array(s) 112 may be located on an exterior surface of the headset 100, on an interior surface of the headset 100, separate from the headset 100 (e.g., part of some other device), or some combination thereof. The number and/or locations of microphone array(s) 112 may be different from what is shown in FIG. 1. For example, the number of locations of microphone arrays 112 may be increased to increase the amount of audio information collected, the sensitivity of the microphones, and/or accuracy of the information collected by the microphones.

The speaker(s) 114 may be configured to convert an electrical signal from the headset 100 to a corresponding sound. In some examples, the speakers 114 may comprise a transducer, a front air cavity, and a back air cavity. The transducer may comprise a diaphragm and an electrodynamic motor, which may include one or more sets of voice coils and/or magnets, such that when a current passes through a coil of the speaker 114, a fluctuating electromagnetic force is transferred to the diaphragm. The motion of the diaphragm may cause sound to be emitted that is audible to human ears. Other examples of speaker configurations are also considered.

The actuators 116 and/or the terminals 118 may be located on or near portions of the end pieces of the headset 100 that curl behind the ear of the user. In this way, the actuators 116 may deliver audio to the user via cartilage conduction when contact with skin of the user is made near the pinna and/or tragus of the user. Additionally, the actuators 116 may contact skin of the user on or near the ear of the user such that when the terminals 118 provide a voltage to the actuators 116, the audio controller 120 may determine whether adequate skin contact has been made with the actuators 116 to provide audio via cartilage conduction.

In some examples, any or all of the actuators 116 may be mechanical actuators configured to generate a vibration that is interpreted by a wearer of the headset 100 as sound when the actuators 116 are in contact with skin of the wearer. For instance, the actuators 116 may provide a force (e.g., vibration) applied to an outer ear of the user such that, when the actuators 116 are placed properly, the user perceives the force as sound when the force is transferred to the inner ear. Alternatively or additionally, one or more of the actuators 116 may include a piezoelectric device that applies a voltage to a piezoelectric material to create mechanical motion that is converted to audible sound. In at least some examples, the actuators 116 supply force and/or vibration in addition to sound supplied by the speaker(s) 114 to create a unique auditory experience for a wearer of the headset 100. Alternatively or additionally, the actuators 116 may provide audio to a wearer of the headset 100 in place of audio provided by the speaker(s) 114, such as if the wearer wants to listen to the audio without disturbing others nearby with sound output by the speaker(s) 114.

The terminals 118 may be configured to provide an electrical current at a predetermined voltage to the actuators 116 to determine whether the actuators 116 have sufficient contact with the user to administer audio via cartilage conduction. One or more of the terminals 118 may include a power output connection to emit a voltage signal at a particular voltage (e.g., 0.1V to 5V for an electrodynamic actuator, or another voltage based on the type of actuator being used). Additionally, the audio controller 120 may include or be coupled to a sensor (e.g., a multimeter or a current sense resistor) to measure the electrical current received after the voltage is provided to the actuators 116.

In some examples, the audio controller 120 determines an impedance of electrical current across one or more of the terminals 118 and one or more of the actuators 116 to which the voltage signal is provided. In an illustrative example, the audio controller 120 may cause the terminal 118(A) to provide a voltage signal to the actuator 116(A). The actuator 116(A) subsequently receives the voltage, creating a current flow to pass through the actuator 116(A). In some examples, objects (such as skin) that are in contact with the actuator 116(A) may affect the impedance, causing an electrical current of the voltage signal to change. The audio controller 120 may detect the electrical current of the voltage signal after the voltage signal passes through the actuator 116(A). The audio controller 120 may then determine the impedance between the terminal 118(A) and the actuator 116(A), by dividing the voltage signal by the electrical current detected after passing through the actuator 116(A), such as by the following:

$$Z = \frac{V}{I}$$

Where Z corresponds to the impedance in ohms, V corresponds to the voltage signal provided by the terminal in volts, and I corresponds to the detected current in amperes.

Additionally, the audio controller 120 may determine whether there is sufficient contact with skin of the user to deliver audio via cartilage conduction using one or more threshold impedances. In some examples, the audio controller 120 may determine that the impedance is less than (or equal to) a threshold impedance, which may indicate that there is sufficient skin contact to deliver audio via the actuators 116 for cartilage conduction. Because contact between the actuators 116 and skin can cause a lower impedance to the electrical current than no contact (e.g., the actuators 116 contacting air), impedances detected below a threshold value (e.g., 70 ohms) for a frequency of interest (e.g., a resonant frequency associated with the actuator) may indicate that there is sufficient contact to deliver audio via the actuators 116 for cartilage conduction. Furthermore, the audio controller 120 may monitor the impedance at frequencies of interest that correspond to one or more resonance frequencies of the actuators 116, and determine that the changes in impedance at the resonance frequency or frequencies indicate changes in the condition of contact between the actuator and the user.

Accordingly, in some scenarios, the audio controller 120 may determine that the impedance is greater than the threshold impedance, which may indicate that there is insufficient skin contact to deliver audio via the actuator 116 for cartilage conduction. In such cases, the audio controller 120 may cause a notification to be displayed on the display element 104 or other location of the device to adjust placement of the headset 100 to reduce the impedance. For example, the notification may include instructions for the user to increase skin contact at or near the actuators 116. The audio controller 120 may analyze and provide notifications for any number of actuators, such as the actuator 116(A) on a first earpiece and/or the actuator 116(B) on a second earpiece. Additional details regarding threshold impedance values that the audio controller 120 may use to determine whether there is sufficient skin contact to deliver audio via the actuators 116 for cartilage conduction may be found in relation to FIG. 5.

In some examples, the audio controller 120 may leverage additional information, such as information provided by the sensor arrays 110, to determine whether the headset 100 is positioned properly to provide audio via cartilage conduction. In an illustrative example, a user may be holding the headset 100 in their hand such that one or more of the actuators 116 are in contact with skin of the user's hand. The audio controller 120 may use information provided by a different sensor, such as an accelerometer, to determine that despite the skin contact with one or more of the actuators 116, the headset 100 is not properly positioned to provide audio via cartilage conduction.

In some instances, sensor arrays 110 may detect motion of the headset 100 subsequent to the notification with instructions to increase skin contact being presented on the display element 104. The sensor arrays 100 may provide an indication of the motion of the headset 100 to the audio controller 120. In some examples, the audio controller 120 may determine that the motion of the headset 100 corresponds to an adjustment of the placement of the headset 100 relative to the user, such as to increase skin contact is instructed by the notification. In response to determining that the placement of the headset 100 has been adjusted by the user, the audio controller 120 may repeat the impedance analysis to determine if adequate skin contact has been achieved to administer audio via cartilage conduction. For example, the audio controller 120 may provide a second voltage signal from the terminal, and detect a second electrical current associated with the voltage signal passing through the actuator as described above. The audio controller 120 may then determine an impedance based on the voltage signal and the second electrical current across the terminal and the actuator. Further, the audio controller 120 may compare the impedance to the threshold impedance, and based on the value of the impedance relative to the threshold, may provide audio to the user from the actuators 116 via cartilage conduction, or output another notification to again adjust the placement of the headset 100.

Additionally, in some cases, the audio controller 120 may detect impedance as the user wears the headset 100 (e.g., continuously or intermittently). For example, the user may bump the headset 100 during wear, or move in such a way that the headset 100 moves relative to the user. Such movement of the headset 100 may cause skin contact to be lost at the actuators 116, thus reducing quality of audio delivered via cartilage conduction. In some cases, the audio controller 120 may have been providing audio via cartilage conduction using the actuators 116 prior to movement of the headset 100 causing loss of skin contact at the location of the actuators 116. The sensor arrays 110 may provide an indication of such movement to the audio controller 120, which may cause the audio controller 120 to analyze the impedance between the terminals 118 and the actuators 116 as described above. Additionally, the audio controller 120 may compare the impedance to the threshold impedance, and based on the value of the impedance relative to the threshold, may provide audio to the user from the actuators 116 via cartilage conduction, or output another notification to again adjust the placement of the headset 100.

The audio system is not limited to the microphone array 112, the speaker 114, the actuators 116, the terminals 118, and the audio controller 120 described herein, and in some cases, may include different and/or additional components. Additionally, in some examples, functionality described with reference to the components of the audio system can be distributed among various components differently than as described in relation to FIG. 1. For example, some or all of the functions of the audio controller 120 may be performed by a remote server. In addition to the functionality described above, the audio controller 120 may be configured to generate direction of arrival (DOA) estimates, generate acoustic transfer functions (e.g., array transfer functions and/or head-related transfer functions), track the location of sound sources, form beams in the direction of sound sources, classify sound sources, optimize performance of the microphone array 112, optimize performance of the actuators 116 and the terminals 118, and the like.

Figure 2:
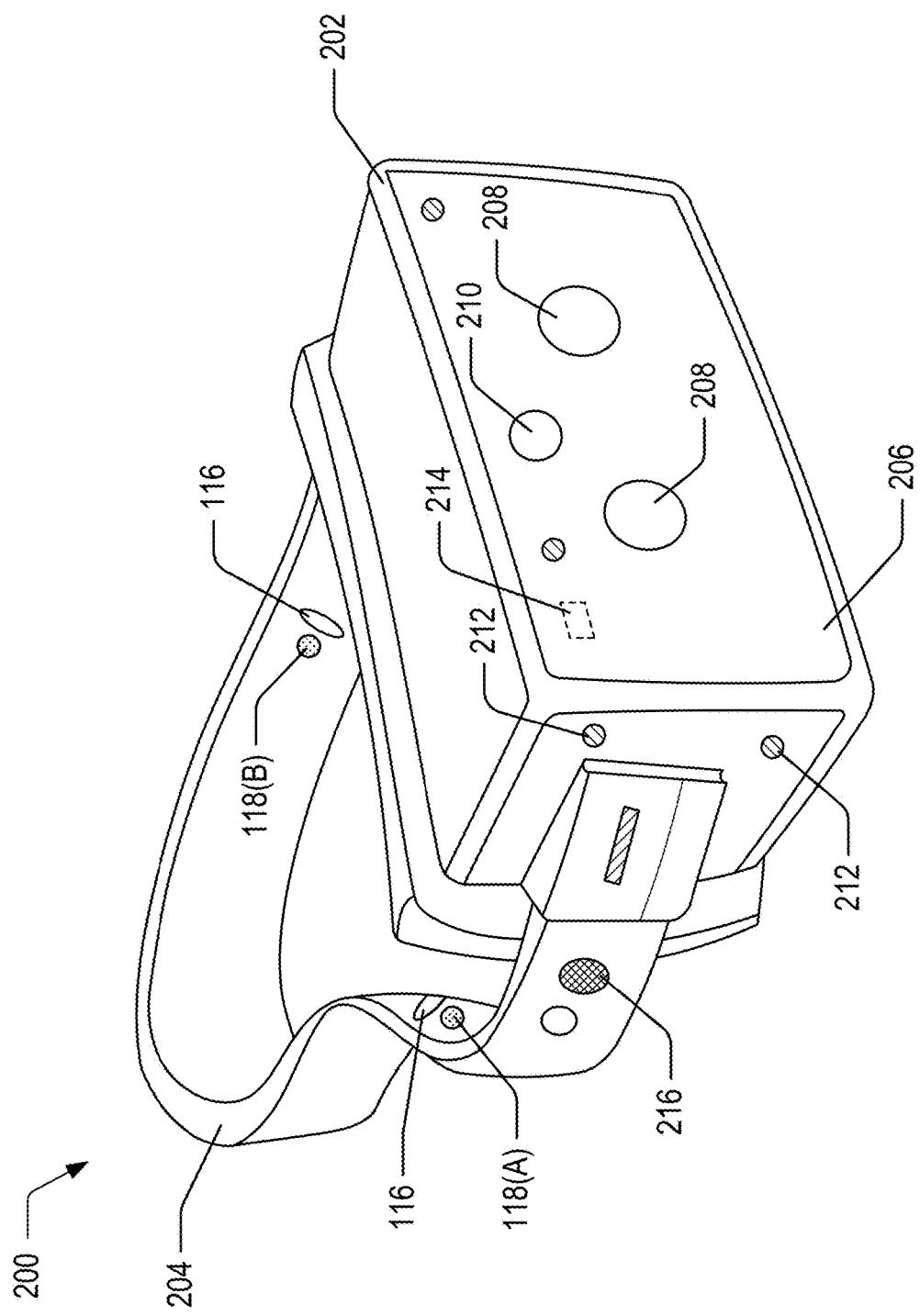
FIG. 2 is a perspective view of another example electronic device, implemented as a head-mounted display, that includes an audio system configured to detect contact via impedance analysis, in accordance with one or more examples.

FIG. 2 is a perspective view of a headset, implemented as a head-mounted display (HMD) 200, configured to detect contact via an impedance analysis in accordance with one or more examples. In examples, portions of a front side of the HMD 200 are at least partially transparent in the visible band (e.g., ~380 nm to 750 nm), and portions of the HMD 200 that are between the front side of the HMD 200 and an eye of the user are at least partially transparent (e.g., a partially transparent electronic display). The HMD 200 includes a front rigid body 202 and a band 204. In some examples, the HMD 200 includes some or all of the same components described above with reference to FIG. 1, which may be modified to integrate with the form factor of the HMD 200. For example, the HMD 200 may include a display assembly 206, a DCA, and an audio system. Additionally, in examples, the HMD 200 includes one or more imaging devices 208, an illuminator 210, one or more microphone array(s) 212, an audio controller 214, and one or more displacement sensors 216. The HMD 200 also includes the actuators 116 and the terminals 118, which may be located on the band 204 in some cases. Different components may be located in various locations, such as coupled to the band 204, coupled to the front rigid body 202, or may be configured to be inserted within the ear canal of a user, to name a few examples.

Audio System for Audio Source Localization

Figure 3:
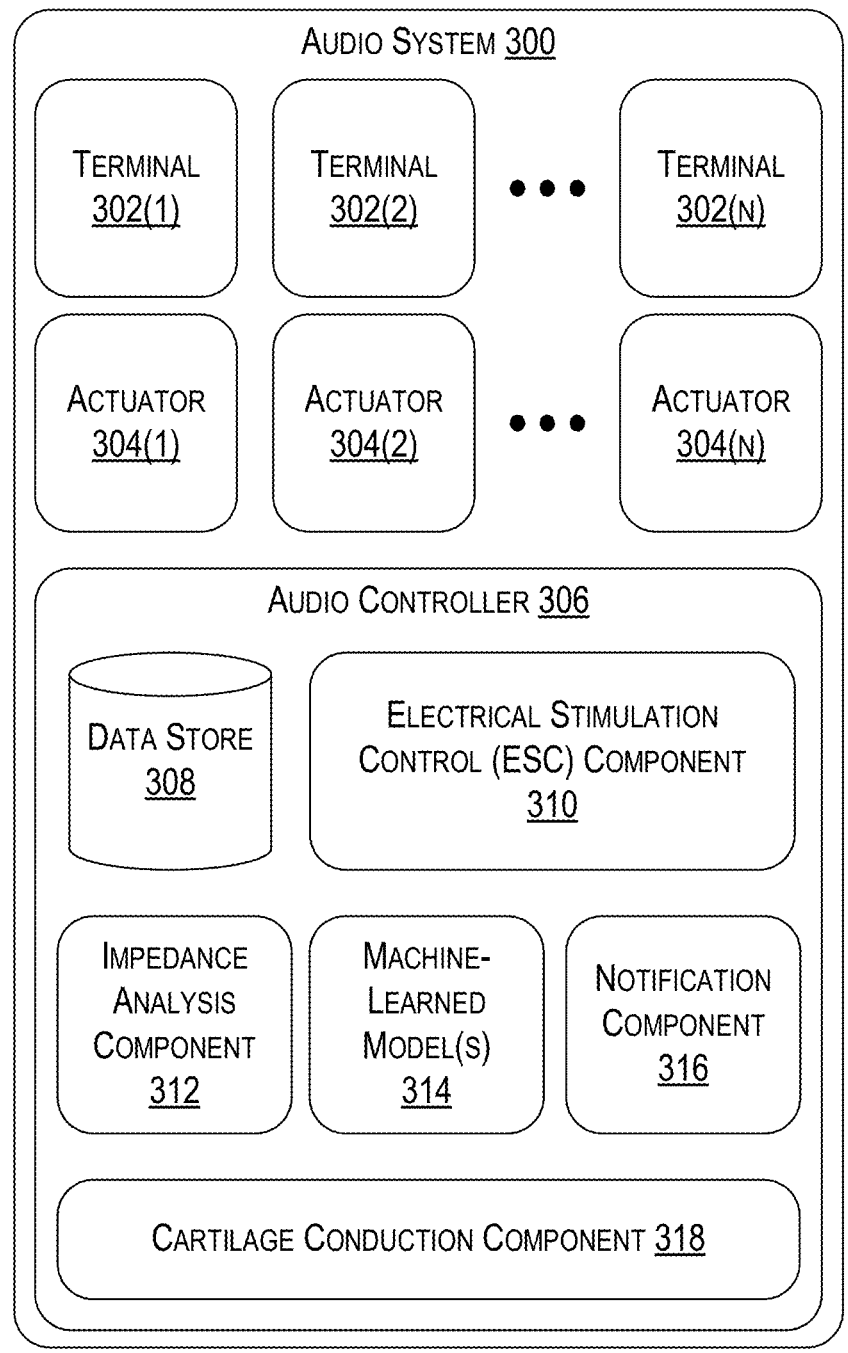
FIG. 3 is a block diagram of an example audio system which may be included in or used in association with an electronic device, in accordance with one or more examples.

FIG. 3 is a block diagram of an audio system 300, in accordance with one or more examples. The audio system 300 may be implemented in an electronic device, such as the headset 100 of FIG. 1 and/or the HMD 200 of FIG. 2, although other types of electronic devices may implement the audio system as well, such as hearing aids, mobile devices, tablets, headphones, earbuds, and so on. The audio system 300 provides audio to a user of a device in which the audio system 300 is incorporated, such as the headset 100 and/or the HMD 200. In some examples, the audio system 300 provides audio via cartilage conduction.

To ensure that the user receives a quality audio experience with the audio provided via cartilage conduction, the audio system 300 may analyze an impedance of voltage signals provided by terminals to one or more actuators of the audio system 300. If the audio system 300 determines that the impedance corresponds to sufficient skin contact with the user, the audio system 300 may proceed to provide audio via cartilage conduction. Alternatively or additionally, if the audio system 300 determines that the impedance corresponds to insufficient skin contact with the user, the audio system 300 may output a notification to the user to adjust placement of the electronic device that includes the audio system 300 to improve skin contact. Accordingly, audio is provided via cartilage conduction more accurately and efficiently than conventional techniques that rely upon lengthy audio calibration routines that require skilled users to provide usable feedback during the calibration process. In examples, the audio system 300 includes a terminal 302(1), a terminal 302(2), . . . a terminal 302(n) (collectively, "terminals 302"). The audio system 300 also includes an actuator 304(1), an actuator 304(2), . . . an actuator 304(n) (collectively, "actuators 304"). The terminals 302 may be configured to provide a voltage signal to the actuators 304, and/or detect an electrical current as the voltage signal returns to the terminals 302 from the actuators 304. The terminals 304 may also include a sensor to measure properties of a detected electrical current and provide information related to the measured properties to an audio controller 306.

The actuators 304 may correspond to the actuators 116 of FIG. 1, being configured to provide audio via cartilage conduction. Similar to the discussion above, any or all of the actuators 304 may be mechanical actuators configured to generate a vibration that is interpreted by a wearer of an electronic device comprising the audio system 300 as sound when the actuators 304 are in contact with skin of the wearer. For instance, the actuators 304 may provide a force (e.g., vibration) applied to an outer ear of the user such that, when the actuators 304 are placed properly, the user perceives the force as sound when the force is transferred to the inner ear. In at least some examples, the actuators 304 supply force and/or vibration in addition to sound supplied by the speaker(s) 114 of FIG. 1 to create a unique auditory experience for a wearer. Alternatively or additionally, the actuators 304 may provide audio to a wearer in place of audio provided by the speaker(s) 114, such as if the wearer wants to listen to the audio without disturbing others nearby with sound output by the speaker(s) 114.

As shown, the audio system 300 may include the audio controller 306, which may correspond to the audio controller 120 and/or the audio controller 214 described above. The audio controller 306 processes data (e.g., information generated by a sensor of any of the terminals 302 associated with a voltage signal and/or a detected electrical current) to determine an impedance between one or more of the terminals 302 and one or more of the actuators 304. The audio controller 306 may also perform additional processing operations on the data received from the terminals 302 prior to providing audio via cartilage conduction, and/or notifying a user to increase skin contact near the terminals 302. In some examples, the audio controller 306 includes a data store 308, an electrical stimulation control ("ESC") component 310, an impedance analysis component 312, one or more machine-learned models 314, a notification component 316, and a cartilage conduction component 318. In some cases, the audio controller 306 includes other modules and/or components than those described herein.

The data store 308 may store data relevant to the audio system 300. For example, the data store 308 may store information related to the characteristics of the terminals 302, data relating to impedances associated with different materials (e.g., skin, air, hair, fabric, etc.) that may come in contact with the actuators 304, settings that adjust characteristics of audio output by the actuators 304 (and/or the speaker 114) based on a particular user's perception of the audio, and the like. In addition, data in the data store 308 may include sounds recorded in the local area of the audio system 300, audio content, head-related transfer functions (HRTFs), transfer functions for one or more sensors, array transfer functions (ATFs) for one or more acoustic sensors, sound source locations, a virtual model of the local area, direction of arrival estimates, sound filters, and other data relevant for use by the audio system 300, or any combination thereof.

The ESC component 310 may be configured to control the voltage and/or the current level of voltage signals emitted by the terminals 302. For example, the ESC component 310 may cause one or more of the terminals 302 provide a voltage signal via a power output connection at a particular voltage (e.g., 0.1V to 5V for electrodynamic actuators, as described above). In at least some examples, the ESC component 310 may control a timing of voltage signals emitted by the terminals 302. For instance, the ESC component 310 may receive an indication from the sensor arrays 110 of FIG. 1 that the headset 100 has been placed on a head of a user, and in response, the ESC component 310 may cause the terminals 302 to provide a voltage signal for impedance analysis for the initial placement of the headset 100. In at least some examples, the ESC component 310 may receive an indication from the sensor arrays 110 that the headset 100 has moved relative to the user during wear, and in response, the ESC component 310 may cause the terminals 302 to provide a voltage signal for impedance analysis to ensure sufficient skin contact remains following movement of the headset relative to the user. Alternatively or additionally, the ESC component 310 causes the terminals 302 to provide voltage signals for impedance analysis continuously, and/or at regular (or irregular) intervals (e.g., every 5 seconds, every 30 seconds, every minute, etc.), to ensure that sufficient skin contact is maintained throughout wear of the headset 100. Although reference is made to the headset 100, examples are considered in which the ESC component 310 performs functions for the HMD 200 and/or a different electronic device as well.

In some examples, the impedance analysis component 312 is configured to determine an impedance of the electrical current associated with the voltage signal provided by the terminals 302 to the actuators 304. As described above, the terminal 302(1) may provide a voltage signal to the actuator 304(1), such as according to settings dictated by the ESC component 310. Additionally, the terminal 302(1) may detect an electrical current associated with the voltage signal using a sensor of the terminal 302(1), where contact by the actuator 304(1) with a material (such as air, skin, hair, fabric, etc.) may affect the impedance of the electrical current. Based on the electrical current and the voltage signal, the impedance analysis component 312 determines an impedance between the terminal 302(1) and the actuator 304(1) by the ratio of the voltage to the current. While generally described herein as an impedance across a single terminal and a single actuator, examples are considered in which the impedance analysis component 312 uses two or more terminals associated with an actuator to analyze impedance of the actuator, and/or uses a single terminal to analyze impedance of multiple actuators. In an illustrative example, the terminal 302(1) and the terminal 302(2) may each provide a voltage signal to the actuator 304(1) to analyze impedance of multiple voltage signals applied to a single actuator and refine the impedance determination. In another illustrative example, the terminal 302(1) may provide a voltage signal to the actuator 304(1) and provide a voltage signal to the actuator 304(2), such as to determine impedance over a larger area of the electronic device in which the audio system 300 is incorporated.

The impedance analysis component 312 may also compare the impedance between the terminal 302(1) and the actuator 304(1) to one or more threshold impedances. Various threshold impedances may be stored in the data store 308 and may be accessed by the impedance analysis component 312. In an illustrative example, the data store 308 may store threshold impedances for full contact, partial contact, and no contact with skin of the user. This illustrative example is described in detail in relation to FIG. 5. Alternatively or additionally, the data store 308 may store threshold impedances for different materials, such as skin, air, hair, fabric, and so forth. The impedance analysis component 312 may compare the impedance to one or more of the threshold impedances at different frequencies to determine whether there is sufficient contact with the user to provide audio via cartilage conduction.

In some cases, the impedance analysis component 312 may use the machine-learned models 314 to determine whether there is sufficient contact at or near the actuators 304 to provide audio via cartilage conduction. For instance, the impedance analysis component 312 may input the impedance between the terminals 302 and the actuators 304 into a machine-learned model 314, and receive an indication of quality of the placement of the headset 100 (or HMD 200) from the machine-learned model 314. The indication of quality of the placement of the headset 100 may indicate, for instance, an amount of contact at or near the actuators 304 (e.g., percentage of contact), which of the actuators 304 has better (or worse) contact than other ones of the actuators 304, a classification of the contact (e.g., full contact, partial contact, and no contact), and so forth.

Additionally, in some examples, the machine-learned model 314 may provide an indication of a type or types of material that are causing the impedance. For instance, the machine-learned model 314 may be trained to identify particular frequencies that experience higher impedance when a voltage signal is supplied. In an illustrative example, a particular fabric and skin may cause a same impedance when a voltage signal is supplied, but at different frequencies. Thus, the impedance analysis component 312 may receive an indication from the machine-learned model 314 that there is contact based on the impedance, such as based on the impedance being lower than a threshold impedance. However, the machine-learned model 314 may provide an indication that the contact is with a material that is not skin of a user as indicated by the frequency at which the impedance occurs, and thus the impedance analysis component 312 may determine that there is insufficient contact with skin of the user to provide audio via cartilage conduction.

In some examples, the machine-learned models 314 may include a neural network to generate and/or execute one or more models to improve various aspects of impedance analysis for use in determining whether to provide audio via cartilage conduction. An exemplary neural network is a biologically inspired algorithm which passes input data through a series of connected layers to produce an output. Each layer in a neural network can also comprise another neural network, or can comprise any number of layers (whether convolutional or not). As can be understood in the context of this disclosure, a neural network can utilize machine learning, which can refer to a broad class of such algorithms in which an output is generated based on learned parameters.

Although discussed in the context of neural networks, any type of machine learning can be used consistent with this disclosure. For example, machine learning algorithms can include, but are not limited to, regression algorithms (e.g., ordinary least squares regression (OLSR), linear regression, logistic regression, stepwise regression, multivariate adaptive regression splines (MARS), locally estimated scatterplot smoothing (LOESS)), instance-based algorithms (e.g., ridge regression, least absolute shrinkage and selection operator (LASSO), elastic net, least-angle regression (LARS)), decisions tree algorithms (e.g., classification and regression tree (CART), iterative dichotomiser 3 (ID3), Chi-squared automatic interaction detection (CHAID), decision stump, conditional decision trees), Bayesian algorithms (e.g., naïve Bayes, Gaussian naïve Bayes, multinomial naïve Bayes, average one-dependence estimators (AODE), Bayesian belief network (BNN), Bayesian networks), clustering algorithms (e.g., k-means, k-medians, expectation maximization (EM), hierarchical clustering), association rule learning algorithms (e.g., perceptron, back-propagation, hopfield network, Radial Basis Function Network (RBFN)), deep learning algorithms (e.g., Deep Boltzmann Machine (DBM), Deep Belief Networks (DBN), Convolutional Neural Network (CNN), Stacked Auto-Encoders), Dimensionality Reduction Algorithms (e.g., Principal Component Analysis (PCA), Principal Component Regression (PCR), Partial Least Squares Regression (PLSR), Sammon Mapping, Multidimensional Scaling (MDS), Projection Pursuit, Linear Discriminant Analysis (LDA), Mixture Discriminant Analysis (MDA), Quadratic Discriminant Analysis (QDA), Flexible Discriminant Analysis (FDA)), Ensemble Algorithms (e.g., Boosting, Bootstrapped Aggregation (Bagging), AdaBoost, Stacked Generalization (blending), Gradient Boosting Machines (GBM), Gradient Boosted Regression Trees (GBRT), Random Forest), SVM (support vector machine), supervised learning, unsupervised learning, semi-supervised learning, etc. Additional examples of architectures include neural networks such as ResNet50, ResNet101, VGG, DenseNet, PointNet, and the like.

In some examples, the impedance analysis component 312 may analyze impedances at more than one frequency of the electrical current between the terminals 302 and the actuators 304 to determine whether there is sufficient contact to deliver audio via cartilage conduction. In some instances, applying more than one threshold to multiple frequencies of the electrical currents increases the accuracy of the analysis of whether there is sufficient contact, what types of materials are impeding the electrical currents, and so forth. In an illustrative example, the impedance analysis component 312 may compare the detected impedance to a first threshold impedance of 70 ohms between frequencies of 100 and 1000 Hz. Additionally, the impedance analysis component 312 may compare the detected impedance to a second threshold impedance of 7 ohms between frequencies of 0 and 10 Hz. If the detected impedance is greater than or equal to both of the thresholds between the respective frequencies, the impedance analysis component 312 may determine that there is no contact with the skin of the user. If the detected impedance is less than both of the thresholds between the respective frequencies, however, the impedance analysis component 312 may determine that there is sufficient contact with the skin of the user. Other threshold impedances and frequency ranges are also considered.

In examples in which the impedance analysis component 312 determines that there is insufficient contact with skin of the user to provide audio via cartilage conduction, the impedance analysis component 312 may instruct the notification component 316 to output a notification to the user to adjust placement of the electronic device to reduce (or increase) the impedance. In at least some examples, the notification component 316 outputs the notification as a visual notification on a display, such as the display elements 104 of FIG. 1. A visual notification may include a message such as "Bring earpiece closer to your ear" when the impedance analysis component 312 determines that there is no contact or partial contact with skin of the user. Alternatively or additionally, the notification component 316 outputs the notification as an auditory notification via the speaker 114 of FIG. 1. For instance, in addition to the message "Bring earpiece closer to your ear" displayed on the display element 104, the notification component 316 may provide a beep on the particular earpiece (of two earpieces) that should be adjusted to improve contact with the actuators 304. In other examples, the notification can be presented via another interface (e.g., an LED indicator, a haptic vibration, a notification on a user's mobile device, etc.).

In examples in which the impedance analysis component 312 determines that there is sufficient contact with skin of the user to provide audio via cartilage conduction, the impedance analysis component 312 may instruct the cartilage conduction component 318 to provide audio via cartilage conduction. As described above, the cartilage conduction component 318 may control the actuators 304 to convert electrical signals to mechanical vibrations near the pinna or tragus of the ear of the user to provide audio via cartilage conduction.

Figure 4:
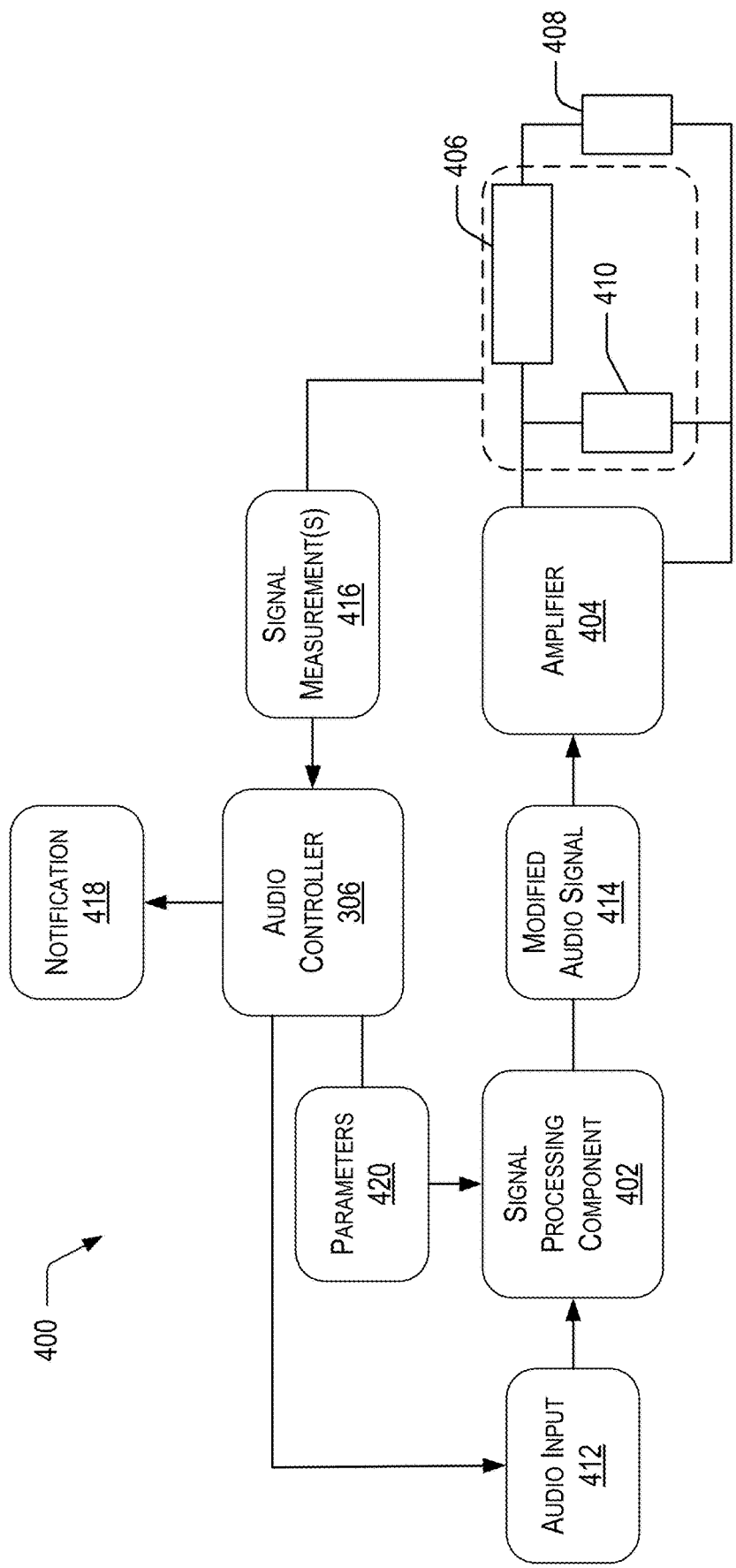
FIG. 4 is a schematic illustration of example components that may be incorporated into an electronic device to implement the techniques for detecting contact via impedance analysis according to the techniques described herein.

FIG. 4 depicts a system 400 that includes example components that may be incorporated into an electronic device to implement the techniques for detecting contact via impedance analysis according to the techniques described herein. The components depicted in the example system 400 may be incorporated into the headset 100, the headset 200, and/or the audio system 300, for example. In some examples, the system 400 includes the audio controller 306 of FIG. 3, along with a signal processing component 402, an amplifier 404, a current sensor 406, an actuator 408, and a voltage sensor 410.

The amplifier 404 may include one or more terminals for providing electrical current, such as the terminals 118 of FIG. 1 and/or the terminals 302 of FIG. 3 described above. Additionally, the actuator 408 may correspond to the actuators 116 of FIG. 1 and/or the actuators 304 of FIG. 3. The configuration of the audio controller 306, the signal processing component 402, the amplifier 404, the current sensor 406, the actuator 408, and the voltage sensor 410 are intended only as an example. For instance, systems are considered that omit the current sensor 406 or the voltage sensor 410, and/or arrange the circuitry connecting the audio controller 306, the amplifier 404, the current sensor 406, the actuator 408, or the voltage sensor 410 differently than shown.

In examples, the signal processing component 402 receives an audio input 412 from the audio controller 306. In at least some examples, the audio input 412 may comprise a signal that includes information related to audio to be output to a user of an electronic device associated with the system 400 via cartilage conduction. The signal processing component 402 may modify the audio input 412 to generate a modified audio signal 414. For instance, the signal processing component 402 may generate the modified audio signal 414 to tailor the audio performance of the electronic device to that of a desired reference, such as by determining a frequency response that will match a target. In an illustrative example, a signal processing filter controlled by the signal processing component 402 may boost and/or diminish certain frequency ranges output by the system 400. The signal processing component 402 may use impedance data to estimate a frequency response of the system 400, where the signal processing filter may be set to provide a desired frequency response target provided by the system 400.

Alternatively or additionally, the signal processing component 402 may adjust one or more signal processing algorithms based on measured voltage signals and/or measured current. For example, the signal processing component 402 may cause a signal processing algorithm to adjust output by a bass and/or treble filter. In another example, the signal processing component 402 may adjust a signal processing algorithm based on a relationship between the impedance on the voltage signal by the actuator and particular frequencies of sound delivered by the actuator.

The amplifier 404 may receive the modified audio signal 414 and amplify the modified audio signal 414 to be provided as a voltage signal to the actuator 408. For example, the actuator 408 may use the modified audio signal 414 as amplified by the amplifier 404 to generate a mechanical vibration that, when positioned near a pinna or tragus of the user, causes the user to perceive sound based on cartilage conduction resulting from the mechanical vibration. As the voltage signal is provided to the actuator 408, the current sensor 406 and the voltage sensor 410 may measure the current and voltage of the voltage signal. The current sensor 406 and/or the voltage sensor 410 may provide the audio controller 306 with one or more signal measurements 416 corresponding to the voltage signal provided by the amplifier 404, delivered to the actuator 408, and returning to the amplifier 404. The signal measurements 416 may include a current measurement (e.g., in amperes) and/or a voltage measurement (e.g., in volts) of the voltage signal provided to the actuator 408.

As described herein, the audio controller 306 may determine an impedance of the electrical current associated with the voltage signal based on the signal measurements 416. In some cases, the audio controller 306 may determine that there is insufficient contact with the user to provide audio via cartilage conduction based on the impedance determined from the signal measurements 416 (e.g., by comparing the impedance to one or more thresholds). In such cases, the audio controller 306 may provide a notification 418 to the user, such as to suggest that the user move the electronic device to provide better contact with the actuator 408.

Alternatively or additionally, the audio controller 306 may use the signal measurements 416 to derive signal processing parameters which, when used by the signal processing component 402, may equalize sound perceived by the user. The audio controller 306 may provide parameters 420 to the signal processing component 402 to improve equalization and thus improve a user's auditory experience when using the electronic device. As mentioned above, the signal processing component 402 may equalize the audio input 412 to tailor the frequencies output by the electronic device to a that of a desired reference. Using the parameters 420 based on the measurements 416 once audio is being delivered via cartilage conduction, the signal processing component 402 may improve the modifications output as the modified audio signal 414 to better match the desired target frequency spectrum. Additionally, in some cases, the signal processing component 402 may use the parameters 420 to minimize differences in how sounds are perceived between left and right ears in a binaural system.

Furthermore, the audio controller 306 may determine and correct for interaural differences (e.g., the differences between the reception of sound, such as related to timing and intensity, by each ear) using the parameters provided to the signal processing component 402 that are based on the measurements 416. For example, audio controller 306 may use the impedance determined from the measurements 416 to improve the spatial audio delivery for the user. In some cases, the audio controller 306 may use impedance information received from multiple actuators (e.g., one or more actuators proximate a right ear along with one or more actuators proximate a left ear) to determine a quality of fit of the electronic device. The audio controller 306 may determine that one ear has a worse fit than the other (e.g., based on the impedance when audio is provided by the actuator 408). To compensate for the worse fit in one ear, the audio controller 306 may adjust the parameters 420 of the actuator 408 proximate the ear with the worse fit for the interaural level differences. Such an adjustment in interaural level differences can cancel out a "mismatch" between how audio is perceived by the two sides, and can provide a more "equally-loud" sound between the two ears.

Figure 5:
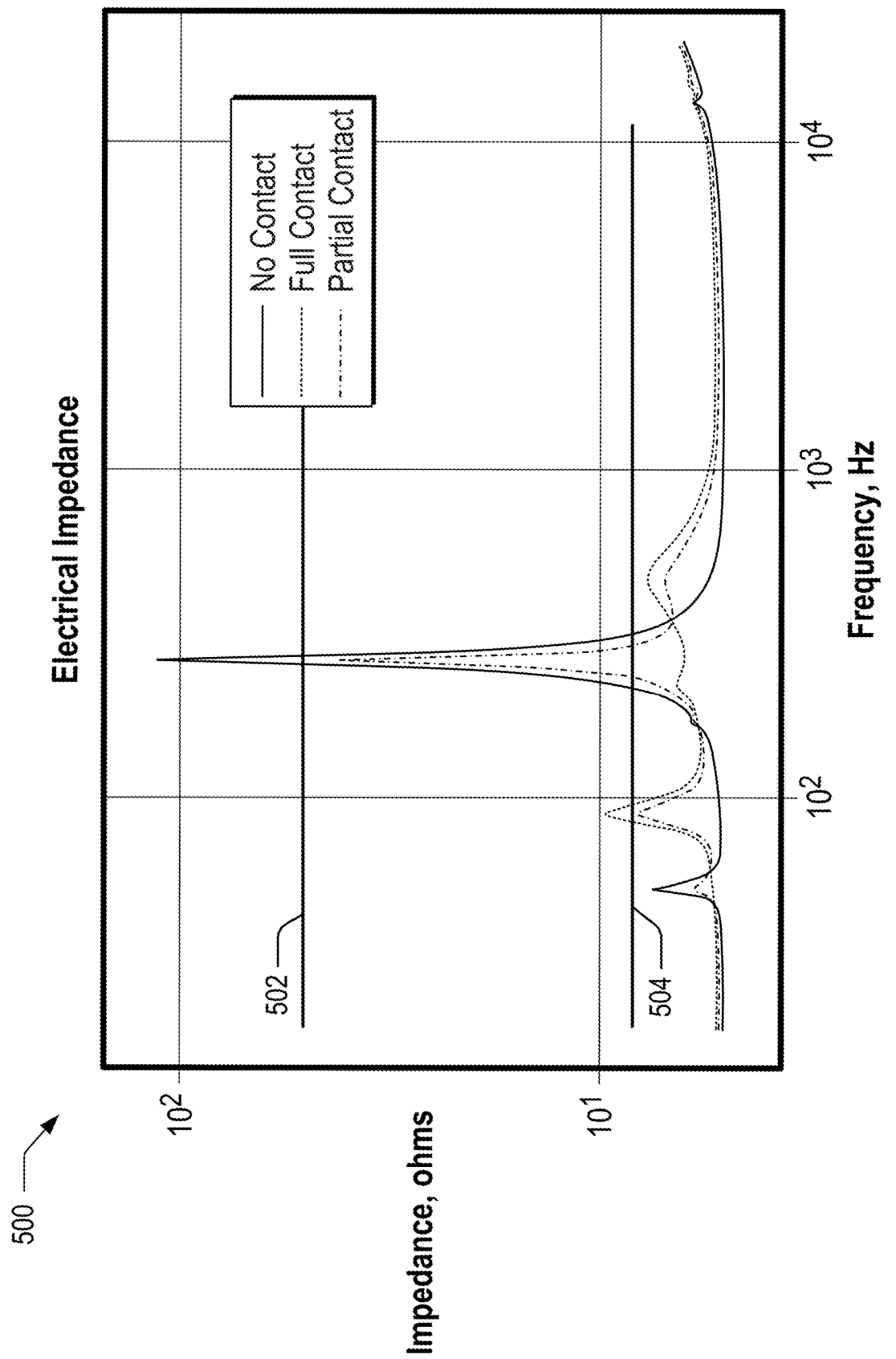
FIG. 5 is a schematic illustration showing example impedances detected at different frequencies involving an electrical signal in which an electronic device has no contact with a user, an electrical signal having full or adequate contact with a user, and an electrical signal having partial contact with a user, in accordance with one or more examples.

FIG. 5 provides an example 500 of impedances detected at different frequencies and associated with different electrical currents, in accordance with the examples described herein. As described above, the audio system 300 may determine whether there is sufficient skin contact with a user to provide audio via cartilage conduction based at least in part on an impedance associated with a voltage signal provided to an actuator and an electrical current associated with the voltage signal. In the illustrated example 500, the audio system 300 has employed multiple thresholds to analyze the impedance of a voltage signal to determine whether there is sufficient contact to provide audio via cartilage conduction.

As illustrated in the example 500, the impedance analysis component 312 of FIG. 3 may compare the detected impedances to a first threshold impedance 502 of 70 ohms. Additionally, the impedance analysis component 312 may compare the detected impedances to a second threshold impedance 504 of 8 ohms. If the detected impedance is greater than or equal to the first threshold impedance 502 between 100 and 1000 Hz of frequency, and less than the second threshold impedance 504 between 0 and 100 Hz of frequency, the impedance analysis component 312 determines, in the illustrated example 500, that there is no contact by the actuator with the skin of the user (indicated by the solid line). If the detected impedance is less than both of the threshold impedances 502 and 504, the impedance analysis component 312 determines that there is partial contact by the actuator with the skin of the user (indicated by the dot-dash line). If the detected impedance is less the first threshold impedance 502 between 100 and 1000 Hz of frequency, and greater than or equal to the second threshold impedance 504 between 0 and 100 Hz of frequency, the impedance analysis component 312 determines that there is sufficient contact by the actuator with the skin of the user to provide audio via cartilage conduction (indicated by the dotted line). Other threshold impedances and frequency ranges are also considered. By applying more than one threshold to multiple frequencies of the electrical currents, the accuracy of the analysis increases to determine whether there is sufficient contact, what types of materials are impeding the electrical currents, and so forth.

Figure 6:
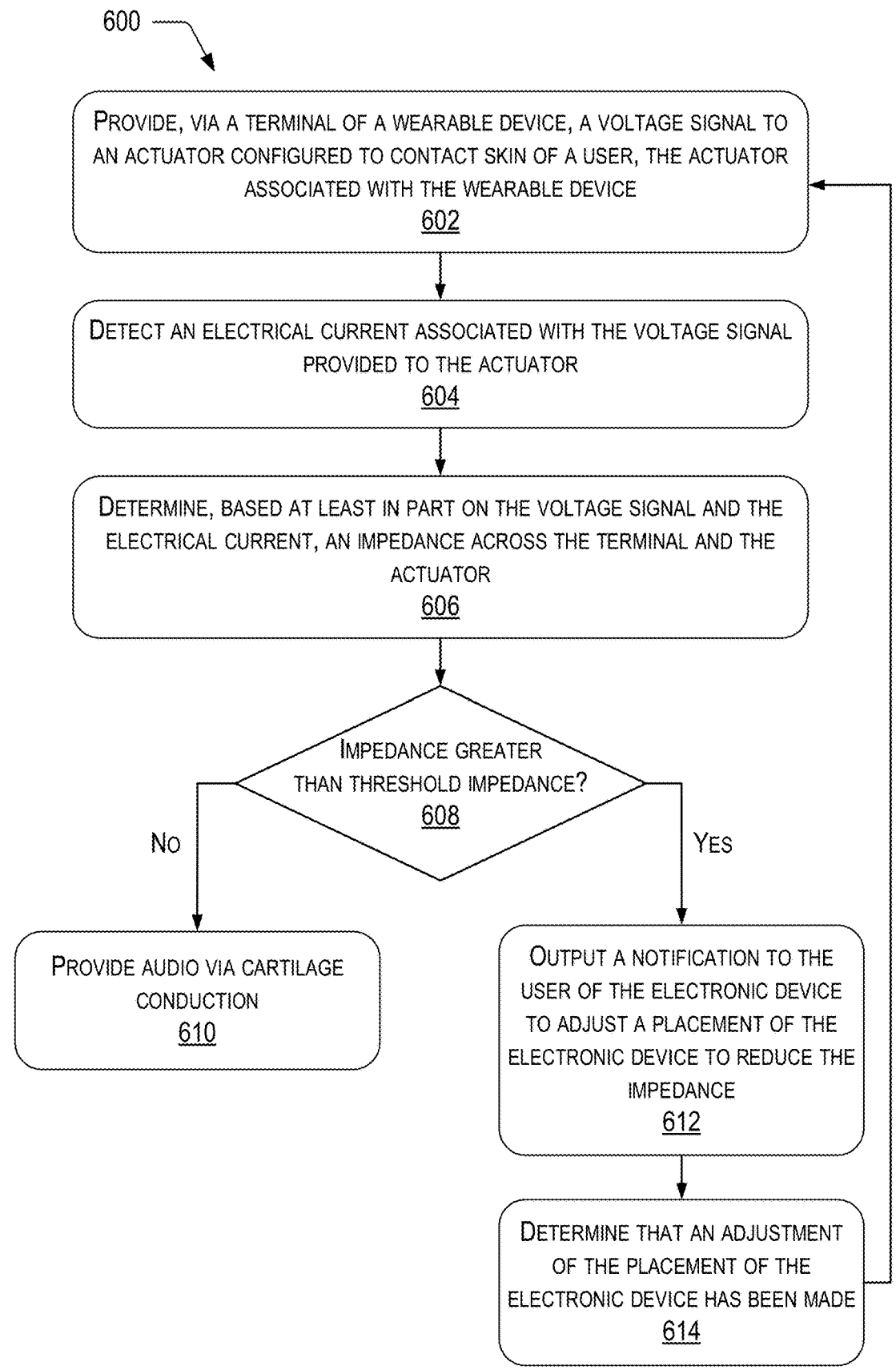
FIG. 6 is a flowchart of an example process for contact detection via an impedance analysis, in accordance with one or more examples.

FIG. 6 is a flowchart of an example process 600 for detecting contact via impedance analysis, in accordance with one or more examples. The process 600 may be performed by components of an audio system (e.g., the audio system 300). As described above, the audio system 300 may be a component of an electronic device (e.g., the headset 100 and/or the HMD 200) configured to analyze, by performing the process 600, an impedance of an electrical current to determine if there is sufficient skin contact by an actuator with a user to provide audio via cartilage conduction. Any of the steps included in the process 600 may be performed by other computing devices, such as a remote computing device or server computing device. In some cases, the process 600 may include different and/or additional steps, or perform the steps in a different order than described herein.

In some examples, the process 600 includes an operation 602, in which a voltage signal is provided via a terminal of a wearable device to an actuator configured to contact skin of a user, where the actuator is associated with the wearable device. For example, the ESC component 310 may cause one or more of the terminals 302 to provide a voltage signal via a power output connection at a particular voltage (e.g., 0.1V to 5V as described above). In some cases, the ESC component 310 may receive an indication from the sensor arrays 110 that the headset 100 has been placed on a head of a user, and in response, the ESC component 310 may cause the terminals 302 to provide a voltage signal for impedance analysis for the initial placement of the headset 100.

An operation 604 includes detecting an electrical current associated with the voltage signal provided to the actuator. In some examples, the audio system 300 may include one or more sensors (e.g., the current sensor 406 and/or the voltage sensor 410) to measure the voltage and/or current level of voltage signal provided to the actuator.

An operation 606 includes determining, based at least in part on the voltage signal and the electrical current, an impedance across the terminal and the actuator. In at least some examples, the audio controller 306 may determine the impedance by a ratio of the voltage (e.g., in volts) to the current (e.g., in amperes). While generally described herein as an impedance across a single terminal and a single actuator, examples are considered in which the impedance analysis component 312 uses two or more terminals and/or two or more actuators to determine whether there is sufficient contact.

An operation 608 includes determining whether the impedance is greater than a threshold impedance. In examples, the impedance analysis component 312 accesses one or more threshold impedances that are stored in the data store 308 to determine whether there is sufficient skin contact with the user to provide audio via cartilage conduction. As described above, the data store 308 may store threshold impedances for full contact, partial contact, and no contact with skin of the user, such as described in relation to FIG. 5. Alternatively or additionally, the data store 308 may store threshold impedances for different materials, such as skin, air, hair, fabric, and so forth. The impedance analysis component 312 may compare the impedance to one or more of the threshold impedances at different frequencies to determine whether there is sufficient contact with the user to provide audio via cartilage conduction. In some cases, the impedance analysis component 312 may use the machine-learned models 314 to determine whether there is sufficient contact at or near the actuators 304 to provide audio via cartilage conduction.

If the impedance is determined to be less than or equal to the threshold impedance (e.g., "No" at operation 608), the process 600 proceeds to an operation 610, in which audio is provided via cartilage conduction. For example, the cartilage conduction component 318 may control the actuators 304 to convert electrical signals to mechanical vibrations near the pinna or tragus of the ear of the user to provide audio via cartilage conduction. In at least some examples, the actuators 304 may supply vibration in addition with sound supplied by the speaker 114 to create a unique auditory experience for a wearer of the headset 100. Alternatively or additionally, the actuators 304 may provide audio to a wearer of the headset 100 in place of audio provided by the speaker 114, such as if the wearer wants to listen to the audio without disturbing others nearby with sound output by the speaker 114. In some cases, the audio controller 306 may continue to monitor placement of the electronic device, and cause the ESC component 310 to provide a voltage signal for analysis of impedance if movement of the electronic device is detected relative to the user.

In some examples, the audio controller 306 may adjust a characteristic of the audio provided to the user via cartilage conduction based at least in part on the impedance. For instance, a characteristic of the audio provided to the user may be associated with interaural level difference or "ILD." In some instances, ILD may be used to deliver spatial audio through headphones and/or cartilage conduction such that sound is perceived at a specific 3D location. To deliver sound that is perceived at a specific 3D location, such as by using ILD, the volume output of audio at the two ears of a user should be generally equal to one another. The ILD, interaural time difference (ITD), and/or head related transfer function (HRTF) may be adjusted to target the specific desired location at which the sound is to be perceived.

In some cases, a baseline output of sound delivered via cartilage conduction may be different at two or more locations (e.g., proximate each of the user's ears), accuracy of the ILD may be reduced. Therefore, the audio controller may determine a difference in preloading force between two or more of the actuators 304, and based on the difference in preloading force, update the ILD to compensate for the difference. For instance, the audio controller 306 may receive data from a pressure sensor indicating an amount of preloading force applied to the pressure sensor. The pressure sensor may be a transducer configured to convert variations in a physical quantity, such as pressure, into an electrical signal indicating an applied force (e.g., in Newtons) to the transducer. The audio controller 306 may determine the preloading force applied to the transducer, and adjust a characteristic of the audio provided via cartilage conduction based at least in part on the preloading force by applying a compensation. For instance, the audio controller 306 may reduce the voltage signal used to output sound via cartilage conduction when the preloading force is greater, or increase the voltage signal used to output sound via cartilage conduction when the preloading force is lower.

Other techniques for measuring preloading force are considered as well. For instance, the audio controller 306 may determine the preloading force from the impedance based on the voltage signal and current, as described herein. Returning to the discussion of FIG. 5, the audio controller 306 may monitor the effect of the preloading force on characteristics as the frequency-dependent curve changes resulting from force applied to the actuators 304, such as resonant frequency, anti-resonant frequency, magnitude of one or more peaks in the curve, and the like. As the frequency-dependent curve changes due to different force applied to the actuators 304, the audio controller 306 may increase and/or decrease one or more thresholds, change a frequency at which a threshold is applied, and so forth.

If the impedance is determined to be greater than the threshold impedance (e.g., "Yes" at operation 608), the process 600 proceeds to an operation 612, in which a notification is output to a user of the electronic device to adjust a placement of the electronic device to reduce the impedance. For instance, the impedance analysis component 312 may instruct the notification component 316 to output a notification to the user to adjust placement of the electronic device to reduce (or increase) the impedance. In at least some examples, the notification component 316 outputs the notification as a visual notification on a display, such as the display elements 104. A visual notification may include a message such as "Bring earpiece closer to your ear" when the impedance analysis component 312 determines that there is no contact or partial contact with skin of the user. Alternatively or additionally, the notification component 316 outputs the notification as an auditory notification via the speaker 114. For instance, in addition to the message "Bring earpiece closer to your ear" displayed on the display element 104, the notification component 316 may provide a beep on the particular earpiece (of two earpieces) that should be adjusted to improve contact with the actuators 304.

An operation 614 includes determining that an adjustment of the placement of the electronic device has been made. In some examples, the audio controller 306 may determine that the motion of the electronic device corresponds to an adjustment of the placement of the electronic device relative to the user, such as to increase skin contact is instructed by the notification. The impedance analysis component 312 may determine that an adjustment of the electronic device has been made based on motion information provided by the sensor arrays 110, and/or by a change in impedance by providing a subsequent voltage signal and analyzing the impedance based on the electrical current associated with the subsequent voltage signal. In response to determining that the placement of the electronic device has been adjusted by the user, the audio controller 306 may repeat the impedance analysis (e.g., by returning to the operation 602) to determine if adequate skin contact has been achieved to administer audio via cartilage conduction.

Example System Environment

Figure 7:
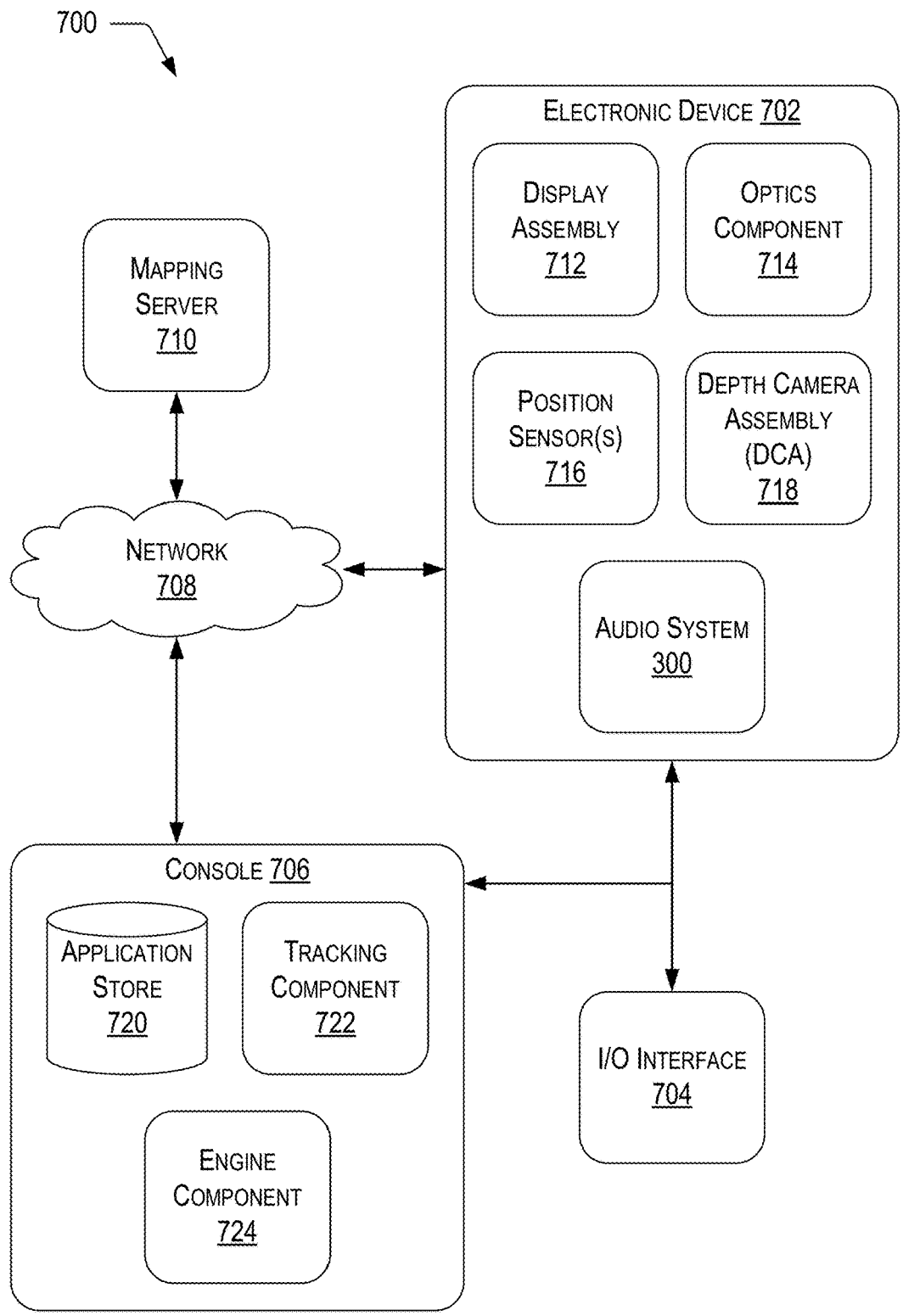
FIG. 7 is a block diagram of an example extended reality system, in accordance with one or more examples.

FIG. 7 is a block diagram of an example system environment 700 for detecting contact via impedance analysis, in accordance with one or more examples. The example system environment 700 may comprise an extended reality environment (e.g., a virtual reality environment, an augmented reality environment, a mixed reality environment, or some combination thereof). The example system environment 700 includes an electronic device 702, an input/output (I/O) interface 704 that is coupled to a console 706, a network 708, and a mapping server 710. In some examples, the electronic device 702 correspond to the headset 100 of FIG. 1, the HMD 200 of FIG. 2, one or more hearing aids, a mobile device, a tablet, glasses or other headwear devices, headphones, or some other type of computing device that is configured to detect contact via an impedance analysis according to the described techniques.

While FIG. 7 shows an example system environment 700 including one electronic device 702 and one I/O interface 704, examples are considered in which any number of these components may be included in the example system environment 700. For example, there may be multiple electronic devices each having an associated I/O interface 704, with each electronic device and I/O interface 704 communicating with the console 706. In some cases, different and/or additional components may be included in the example system environment 700. Functionality described in relation to one or more of the components shown in FIG. 7 may be distributed among the components in a different manner than described herein. For example, functionality described as being associated with the I/O interface 704 may be integrated into the electronic device 702 and/or the console 706. As another example, some or all of the functionality of the console 706 may be provided by the electronic device 702, and vice versa.

The electronic device 702 may include a display assembly 712, an optics component 714, one or more position sensors 716, and a depth camera assembly (DCA) 718. Some examples of the electronic device 702 have different components than those described in relation to FIG. 7. Additionally, the functionality provided by various components described in relation to FIG. 7 may be differently distributed among the components of the electronic device 702 in some examples, or be captured in separate assemblies remote from the electronic device 702.

In examples, the display assembly 712 displays content to a user in accordance with data received from the console 706. The display assembly 712 may display the content using one or more display elements (e.g., the display elements 104). A display element may be, for instance, an electronic display. In some examples, the display assembly 712 may comprise a single display element or multiple display elements (e.g., a display for each eye of a user). Examples of an electronic display include, but are not limited to, a liquid crystal display (LCD), an organic light emitting diode (OLED) display, an active-matrix organic light-emitting diode display (AMOLED), a waveguide display, or some combination of these display types. In some examples, the display assembly 712 may also be configured to perform some or all of the functionality of the optics component 714.

The optics component 714 may magnify image light received from the display assembly 712, correct optical errors associated with the image light, and present the corrected image light to one or both eyeboxes of the electronic device 702. In some examples, the optics component 714 includes one or more optical elements such as an aperture, a Fresnel lens, a convex lens, a concave lens, a filter, a reflecting surface, or any other suitable optical element that can affect image light. In some cases, the optics component 714 may include combinations of different optical elements. In some examples, one or more of the optical elements in the optics component 714 may be coated by one or more coatings, such as partially reflective or anti-reflective coatings.

Magnification and focusing of the image light by the optics component 714 allows an electronic display of the display assembly 712 to be physically smaller, weigh less, and consume less power than larger displays. Additionally, magnification by the optics component 714 may increase the field of view of the content presented by the electronic display. For example, the electronic display may display content in the field of view such that the displayed content is presented using almost all (e.g., approximately 110 degrees diagonal), and in some cases, all of a user's field of view. Additionally, in some examples, an amount of magnification may be adjusted by adding or removing optical elements of the optics component 714.

In some embodiments, the optics component 714 may be designed to correct one or more types of optical error. Examples of optical error include, but are not limited to, barrel or pincushion distortion, longitudinal chromatic aberrations, transverse chromatic aberrations, spherical aberrations, chromatic aberrations, or errors due to the lens field curvature, astigmatisms, and so forth. In some examples, content provided to the electronic display for display to a user may be pre-distorted, and the optics component 714 may correct the distortion after receiving image light associated with the content.

The position sensor 716 may be configured to generate data indicating a position of the electronic device 702. In some examples, the position sensor 716 generates one or more measurement signals in response to motion of the electronic device 702. The position sensor(s) 716 may include one or more of an IMU, accelerometer, gyroscope, magnetometer, another suitable type of sensor that detects motion, or some combination thereof. In some cases, the position sensor 716 may include multiple accelerometers to measure translational motion (forward/back, up/down, left/right) and multiple gyroscopes to measure rotational motion (e.g., pitch, yaw, roll). In some examples, the position sensors 716 include an IMU that rapidly samples measurement signals and calculates an estimated position of the electronic device 702 from the sampled data. For example, the IMU may integrate the measurement signals received from the accelerometers over time to estimate a velocity vector and integrate the velocity vector over time to determine an estimated position of a reference point on the electronic device 702 that describes a position of the electronic device 702 in the environment. The reference point may be defined as a point in space and/or defined as a point within the electronic device 702.

In some examples, the DCA 718 generates depth information for an environment surrounding the electronic device 702. The DCA 718 may include one or more imaging devices, an illuminator, and a DCA controller (not shown). Operation and structure of the DCA 718 is described above with regard to FIG. 1.

The audio system 300 may detect contact with a user via an impedance analysis of a voltage signal provided to an actuator. The audio system 300 causes a voltage signal to be provided to the actuator, followed by detecting an electrical current associated with the voltage signal. The audio system 300 may determine an impedance across the terminal and the actuator based on a ratio of the voltage to the current. The audio system 300 may compare the impedance to a threshold impedance to determine whether there is sufficient skin contact with the actuator. In at least some examples, the audio system 300 may provide audio via cartilage conduction if there is sufficient contact with the user, which may be based on comparing the impedance to the threshold impedance. Alternatively or additionally, the audio system 300 may output a notification (e.g., via the display assembly 712 and/or the speaker 114) to the user to adjust placement of the electronic device 702 to improve contact. As described above with respect to FIG. 3, the audio system 300 may comprise one or more terminals 302, one or more actuators 304, and an audio controller 306. The audio system 300 may include other components than those described herein.

In addition to localizing an audio source, the audio system 300 may perform other functions as well. In some examples, the audio system 300 may request acoustic parameters from the mapping server 710 over the network 708. The acoustic parameters may describe one or more acoustic properties (e.g., room impulse response, a reverberation time, a reverberation level, etc.) of the environment. The audio system 300 may provide information describing at least a portion of the environment from the DCA 718 and/or location information for the electronic device 702 from the position sensor 716. The audio system 300 may generate one or more sound filters using one or more of the acoustic parameters received from the mapping server 710, and use the sound filters to provide audio content to the user.

The I/O interface 704 may be a device that allows a user to send action requests and receive responses from the console 706. In some examples, an action request may be an instruction to start or end capture of image or video data, or an instruction to perform a particular action within an application. The I/O interface 704 may include one or more input devices, such as a keyboard, a mouse, a game controller, or any other suitable device for receiving action requests and communicating the action requests to the console 706. In examples, an action request received by the I/O interface 704 is communicated to the console 706, which performs an action corresponding to the action request. In some examples, the I/O interface 704 includes an IMU that captures calibration data indicating an estimated position of the I/O interface 704 relative to an initial position of the I/O interface 704. In some examples, the I/O interface 704 may provide haptic feedback to the user in accordance with instructions received from the console 706. For example, haptic feedback is provided when an action request is received, or the console 706 communicates instructions to the I/O interface 704 causing the I/O interface 704 to generate haptic feedback when the console 706 performs an action.

In examples, the console 706 provides content to the electronic device 702 for processing in accordance with information received from one or more of the DCA 718, the electronic device 702, and/or the I/O interface 704. In the example shown in FIG. 7, the console 706 includes an application store 720, a tracking component 722, and an engine component 724. Some examples of the console 706 have additional and/or different components than those described in relation to FIG. 7. Additionally, the functions described below may be distributed among components of the console 706 in a different manner than described in relation to FIG. 7. In some examples, the functionality discussed herein with respect to the console 706 may be implemented in the electronic device 702, and/or a remote system.

The application store 720 may store one or more applications for execution by the console 706. An application is a group of instructions, that when executed by a processor, generates content for presentation to the user. Content generated by an application may be in response to inputs received from the user via movement of the electronic device 702 and/or the I/O interface 704. Examples of applications include, but are not limited to, gaming applications, conferencing applications, video playback applications, or other suitable applications.

In some examples, the tracking component 722 tracks movements of the electronic device 702 and/or of the I/O interface 704 using information from the DCA 718, the one or more position sensors 716, or some combination thereof. For example, the tracking component 722 determines a position of a reference point of the electronic device 702 in a mapping of a local area of an environment based on information from the electronic device 702. The tracking component 722 may also determine positions of an object or virtual object. Additionally, in some examples, the tracking component 722 may use data indicating a position of the electronic device 702 from the position sensor 716 as well as representations of the local area from the DCA 718 to predict a future location of the electronic device 702. The tracking component 722 may provide the estimated or predicted future position of the electronic device 702 and/or the I/O interface 704 to the engine component 724.

The engine component 724 may execute applications and receive position information, acceleration information, velocity information, predicted future positions, or some combination thereof, of the electronic device 702 from the tracking component 722. Based on the received information, the engine component 724 may determine content to provide to the electronic device 702 for presentation to the user. For example, if the received information indicates that the user has looked to the left, the engine component 724 may generate content for the electronic device 702 that mirrors the user's movement in a virtual local area or in a local area augmenting the local area with additional content. In another example, the engine component 724 may receive information indicating that a position of the electronic device 702 relative to the user has changed, and may instruct the audio controller 306 to determine whether adequate contact is present following the position change to deliver audio via cartilage conduction. Additionally, the engine component 724 may perform an action within an application executing on the console 706 in response to an action request received from the I/O interface 704 and provide feedback to the user that the action was performed. The provided feedback may be visual or audible feedback via the electronic device 702, or haptic feedback via the I/O interface 704.

In some examples, the network 708 couples the electronic device, the console 706, and the mapping server 710. The network 708 may include any combination of local area and/or wide area networks using both wireless and/or wired communication systems. For example, the network 708 may include the Internet and/or mobile telephone networks. In some cases, the network 708 uses standard communications technologies and/or protocols. Hence, the network 708 may include links using technologies such as Ethernet, 802.11, worldwide interoperability for microwave access (WiMAX), 2G/3G/4G/5G mobile communications protocols, digital subscriber line (DSL), asynchronous transfer mode (ATM), InfiniBand, PCI Express Advanced Switching, and so forth. The networking protocols used on the network 708 may include multiprotocol label switching (MPLS), transmission control protocol/Internet protocol (TCP/IP), User Datagram Protocol (UDP), hypertext transport protocol (HTTP), simple mail transfer protocol (SMTP), file transfer protocol (FTP), and so on. The data exchanged over the network 708 may be represented using technologies and/or formats including image data in binary form (e.g. Portable Network Graphics (PNG)), hypertext markup language (HTML), extensible markup language (XML), and the like. In examples, all or some information may be encrypted using encryption technologies such as secure sockets layer (SSL), transport layer security (TLS), virtual private networks (VPNs), Internet Protocol security (IPsec), and so on.

The mapping server 710 may include a database that stores a virtual model describing a plurality of spaces, where a location in the virtual model corresponds to a current configuration of a local area of the electronic device 702. The mapping server 710 may receive, from the electronic device 702 via the network 708, information describing at least a portion of the environment surrounding the electronic device 702 and/or location information for the environment surrounding the electronic device 702. A user may adjust privacy settings to allow or prevent the electronic device 702 from transmitting information to the mapping server 710. In some examples, the mapping server 710 determines, based on the received information and/or location information, a location in the virtual model that is associated with the local area of the environment where the electronic device 702 is located. The mapping server 710 may determine (e.g., retrieve) one or more acoustic parameters associated with the local area, based in part on the determined location in the virtual model and any acoustic parameters associated with the determined location. The mapping server 710 may transmit the location of the local area and values of acoustic parameters associated with the local area to the electronic device 702.

One or more components of the example system environment 700 may contain a privacy component that stores one or more privacy settings for user data elements. The user data elements describe the user and/or the electronic device 702. For example, the user data elements may describe a physical characteristic of the user, an action performed by the user, a location of the user of the electronic device 702, a location of the electronic device 702, a head related transfer function (HRTF) for the user, and so forth. Privacy settings (or "access settings") for a user data element may be stored in any suitable manner, such as, for example, in association with the user data element, in an index on an authorization server, in another suitable manner, or any suitable combination thereof.

A privacy setting for a user data element specifies how the user data element (or particular information associated with the user data element) can be accessed, stored, or otherwise used (e.g., viewed, shared, modified, copied, executed, surfaced, or identified). In some examples, the privacy settings for a user data element may specify a "blocked list" of entities that may not access certain information associated with the user data element. The privacy settings associated with the user data element may specify any suitable granularity of permitted access or denial of access. For example, some entities may have permission to see that a specific user data element exists, some entities may have permission to view the content of the specific user data element, and some entities may have permission to modify the specific user data element. The privacy settings may allow the user to allow other entities to access or store user data elements for a finite period of time.

The privacy settings may allow a user to specify one or more geographic locations from which user data elements can be accessed. Access or denial of access to the user data elements may depend on the geographic location of an entity who is attempting to access the user data elements. For example, the user may allow access to a user data element and specify that the user data element is accessible to an entity only while the user is in a particular location. If the user leaves the particular location, the user data element may no longer be accessible to the entity. As another example, the user may specify that a user data element is accessible only to entities within a threshold distance from the user, such as another user of a headset within the same local area as the user. If the user subsequently changes location, the entity with access to the user data element may lose access, while a new group of entities may gain access as they come within the threshold distance of the user.

The example system environment 700 may include one or more authorization/privacy servers for enforcing privacy settings. A request from an entity for a particular user data element may identify the entity associated with the request and the user data element may be sent only to the entity if the authorization server determines that the entity is authorized to access the user data element based on the privacy settings associated with the user data element. If the requesting entity is not authorized to access the user data element, the authorization server may prevent the requested user data element from being retrieved or may prevent the requested user data element from being sent to the entity. Although this disclosure describes enforcing privacy settings in a particular manner, this disclosure contemplates enforcing privacy settings in any suitable manner.

Additional Configuration Information

The foregoing description has been presented for illustration; it is not intended to be exhaustive or to limit the scope of the disclosure to the precise forms disclosed. Persons skilled in the relevant art can appreciate that many modifications and variations are possible considering the above disclosure.

Some portions of this description describe the examples in terms of algorithms and symbolic representations of operations on information. These algorithmic descriptions and representations may be used by those skilled in the data processing arts to convey the substance of their work effectively to others skilled in the art. These operations, while described functionally, computationally, or logically, are understood to be implemented by computer programs or equivalent electrical circuits, microcode, or the like. The described operations and their associated components may be embodied in software, firmware, hardware, or any combinations thereof.

Any of the steps, operations, or processes described herein may be performed or implemented with one or more hardware or software modules, alone or in combination with other devices. In examples, a software module is implemented with a computer program product comprising a computer-readable medium containing computer program code, which can be executed by a computer processor for performing any or all the steps, operations, or processes described.

Examples may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Examples may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the patent rights. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A method comprising:
   providing, via a terminal of a wearable device, a voltage signal to an actuator, the actuator associated with the wearable device;
   detecting an electrical current associated with the voltage signal provided to the actuator;
   determining, based at least in part on the voltage signal and the electrical current, an impedance associated with the actuator;
   inputting the impedance into a machine-learned model;
   receiving, from the machine-learned model, an indication of a quality of a placement of the wearable device; and
   outputting, based at least in part on the impedance, a notification via the wearable device, wherein the notification includes an indication of the quality of the placement of the wearable device.

2. The method of claim 1, further comprising comparing the impedance to a threshold impedance associated with cartilage conduction, and wherein the notification is outputted in responsive to determining that the impedance is greater than the threshold impedance.

3. The method of claim 2, wherein the threshold impedance is a first threshold impedance associated with a first frequency, the method further comprising:
   determining that the impedance is greater than a second threshold impedance associated with a second frequency,
   wherein providing the notification is further based at least in part on the impedance being greater than the second threshold impedance associated with the second frequency.

4. The method of claim 1, wherein the impedance is a first impedance, the voltage signal is a first voltage signal, and the electrical current is a first electrical current, the method further comprising:
   comparing the first impedance to a threshold impedance associated with cartilage conduction, and wherein the notification is outputted in responsive to determining that the first impedance is greater than the threshold impedance;
   determining that an adjustment of the placement of the wearable device has been made;
   providing a second voltage signal from the terminal to the actuator;
   detecting a second electrical current associated with the second voltage signal;
   determining, based at least in part on the second voltage signal and the second electrical current, a second impedance associated with the actuator;
   comparing the second impedance to the threshold impedance; and
   responsive to determining that the second impedance is less than the threshold impedance, providing audio via cartilage conduction of the wearable device.

5. The method of claim 4, wherein the audio provided via cartilage conduction of the wearable device is provided using the actuator.

6. The method of claim 4, further comprising adjusting a characteristic of the audio provided via cartilage conduction of the wearable device is based at least in part on the second impedance.

7. The method of claim 1, wherein the voltage signal is provided at a first time, the method further comprising:
   providing, at a second time prior to the first time, audio via cartilage conduction of the wearable device; and
   detecting, at a third time prior to the first time and after the second time, movement of the wearable device, wherein providing the voltage signal at the first time is responsive to detecting the movement of the wearable device.

8. The method of claim 1, wherein the wearable device is configured to couple to an ear of a user such that the terminal and the actuator contact skin on or near the ear of the user.

9. An electronic device comprising:
a terminal configured to provide a voltage signal;
an actuator configured to receive the voltage signal;
one or more processors; and
one or more computer-readable media storing instructions that, when executed by the one or more processors, cause the one or more processors to perform operations comprising:
providing, at a second time prior to a first time, audio to via cartilage conduction of the electronic device;
detecting, at a third time prior to the first time and after the second time, movement of the electronic device;
providing, at the first time, the voltage signal to the actuator via the terminal, wherein providing the voltage signal at the first time is responsive to detecting the movement of the electronic device;
detecting an electrical current associated with the voltage signal provided to the actuator;
determining, based at least in part on the voltage signal and the electrical current, an impedance associated with the actuator; and
outputting, based at least in part on the impedance, a notification via the electronic device to adjust a placement of the actuator.

10. The electronic device of claim 9, wherein the electronic device comprises one of:
headphones,
glasses,
a headset,
a mobile device, or
a hearing aid.

11. The electronic device of claim 9, wherein the electronic device is configured to couple to an ear of a user such that the terminal and the actuator contact skin on or near the ear of the user.

12. The electronic device of claim 9, the operations further comprising:
inputting the impedance into a machine-learned model; and
receiving, from the machine-learned model, an indication of a quality of the placement of the electronic device, wherein the notification includes an indication of the quality of the placement of the electronic device.

13. The electronic device of claim 12, wherein the indication of the quality of the placement of the electronic device includes full contact with skin of a user, partial contact with the skin of the user, or no contact with the skin of the user.

14. The electronic device of claim 9, wherein the operations further comprising comparing the impedance to a threshold impedance, and wherein the notification is outputted in responsive to determining that the impedance is greater than the threshold impedance.

15. The electronic device of claim 14, wherein the threshold impedance is a first threshold impedance associated with a first frequency, the operations further comprising:
determining that the impedance is greater than a second threshold impedance associated with a second frequency,
wherein providing the notification is further based at least in part on the impedance being greater than the second threshold impedance associated with the second frequency.

16. One or more non-transitory computer-readable media storing instructions that, when executed by one or more processors, cause the one or more processors to perform operations comprising:
providing, via a terminal of an electronic device, a first voltage signal to an actuator associated with the electronic device;
detecting a first electrical current associated with the first voltage signal provided to the actuator;
determining, based at least in part on the first voltage signal and the first electrical current, a first impedance associated with the actuator;
outputting, based at least in part on the first impedance, a notification to adjust a placement of the terminal;
determining that an adjustment of the placement of the electronic device has been made;
providing a second voltage signal from the terminal to the actuator;
detecting a second electrical current associated with the second voltage signal;
determining, based at least in part on the second voltage signal and the second electrical current, a second impedance associated with the actuator; and
providing, based at least in part on the second impedance, audio via cartilage conduction the electronic device.

17. The one or more non-transitory computer-readable media of claim 16, the operations further comprising adjusting a characteristic of the audio provided via cartilage conduction based at least in part on the second impedance.

18. The one or more non-transitory computer-readable media of claim 17, the operations further comprising:
determining a preloading force applied to the actuator,
wherein the characteristic of the audio is adjusted based on the preloading force.

19. The one or more non-transitory computer-readable media of claim 16, the operations further comprising:
determining a quality of a placement of the electronic device;
determining a compensation to apply by a signal processor for audio delivered via cartilage conduction based at least in part on the quality of the placement of the electronic device; and
providing the audio via cartilage conduction based at least in part on the compensation.

20. The one or more non-transitory computer-readable media of claim 16, the operations further comprising comparing the first impedance to a threshold impedance associated with cartilage conduction, and wherein the notification is outputted in responsive to determining that the first impedance is greater than the threshold impedance.

* * * * *